United States Patent [19]

Rise

[11] Patent Number: 5,092,235
[45] Date of Patent: Mar. 3, 1992

[54] PRESSURE FIXING AND DEVELOPING APPARATUS

[75] Inventor: James D. Rise, Portland, Oreg.

[73] Assignee: Tektronix, Inc., Beaverton, Oreg.

[21] Appl. No.: 357,382

[22] Filed: May 24, 1989

[51] Int. Cl.⁵ .............................................. B30B 3/04
[52] U.S. Cl. ..................................... 100/168; 100/176
[58] Field of Search ............... 100/155 R, 161, 162 B, 100/163 R, 163 A, 164, 168, 169, 171, 176; 29/116.2

[56] References Cited

U.S. PATENT DOCUMENTS

| | | | |
|---|---|---|---|
| 3,230,604 | 1/1966 | Woxvold | 29/116.2 X |
| 3,293,059 | 12/1966 | Stowell | |
| 3,566,076 | 2/1971 | Fantuzzo et al. | |
| 3,750,246 | 8/1973 | Pessen | 29/116.2 X |
| 4,253,392 | 3/1981 | Brandon et al. | 100/155 R |
| 4,305,191 | 12/1981 | Enomoto | 29/116.2 |
| 4,356,764 | 11/1982 | Haugen | |
| 4,363,862 | 12/1982 | Giorgini | |
| 4,372,247 | 2/1983 | Calabrese | 100/169 X |
| 4,568,949 | 2/1986 | Muranaka | |
| 4,745,420 | 5/1988 | Gerstenmaier | |
| 4,768,050 | 8/1988 | Beery | |

FOREIGN PATENT DOCUMENTS

| | | | |
|---|---|---|---|
| 712794 | 7/1965 | Canada | 100/162 B |
| 799707 | 1/1968 | Canada | 100/155 R |
| 1158032 | 11/1963 | Fed. Rep. of Germany | 100/162 B |
| 60-18351 | 1/1985 | Japan | |

OTHER PUBLICATIONS

Hitachi Metals, Inc. brochure (date unknown) showing a prior art Pressure Fixing Unit.

Primary Examiner—Harvey C. Hornsby
Assistant Examiner—Stephen F. Gerrity
Attorney, Agent, or Firm—John D. Winkelman; Ann W. Speckman

[57] ABSTRACT

A roll type fixing and developing apparatus in which sheet material to be treated is passed through a high pressure nip defined by a pair of rollers and a roller for such apparatus, is described. The roller includes an elongated tubular shell with a pressure applying external surface, an elongated core positioned within the tubular shell, and an elastomeric material disposed between the core and shell to support the shell on the core. The core may be of a number of configurations and may increase in transverse cross-sectional dimension from the respective ends of the core toward the center of the core. The core may taper continuously or in discrete steps from its center toward its first and second ends. In addition, the core may have a longitudinal cross section with a crown in the shape of a beam deflection curve for a simply supported, uniformly constant cross-section beam. The shell may be similarly configured along its interior surface. Also, the elastomer may be compressed at the center of the roller relative to the ends of the roller to preload its center portion. One or more of these rollers may be included in the roll type fixing and developing apparatus.

17 Claims, 3 Drawing Sheets

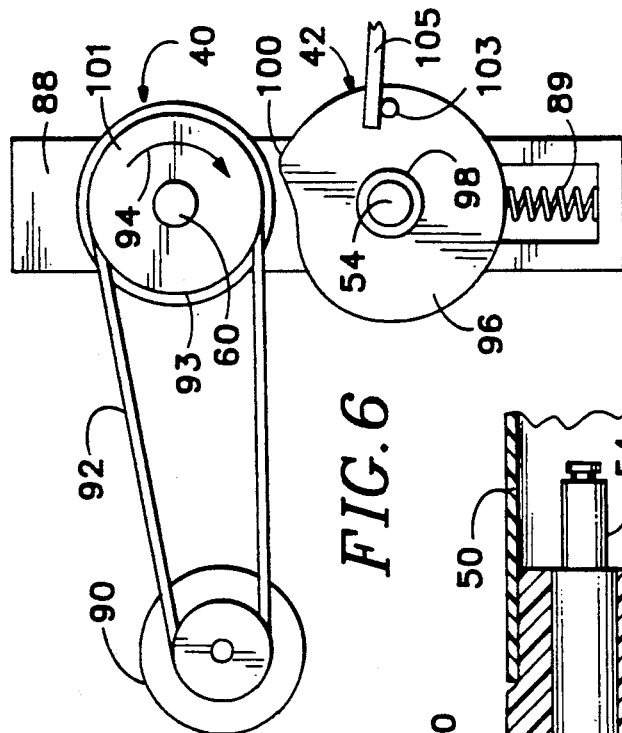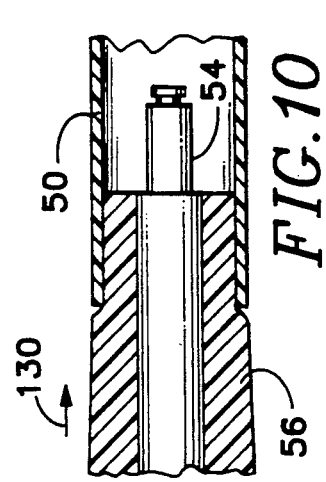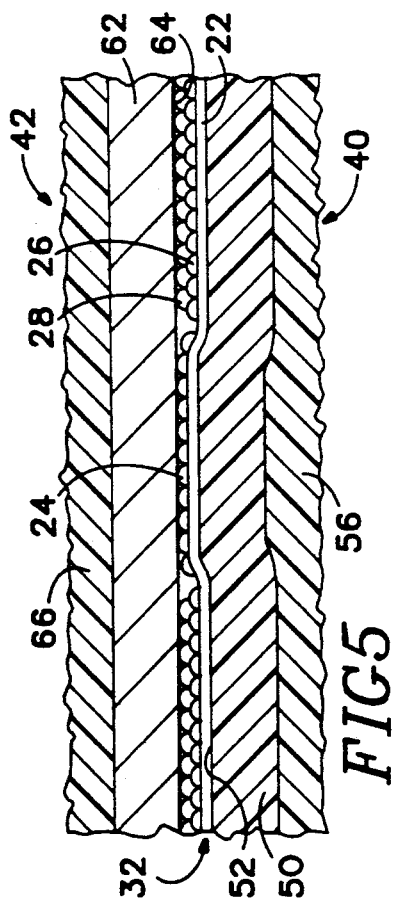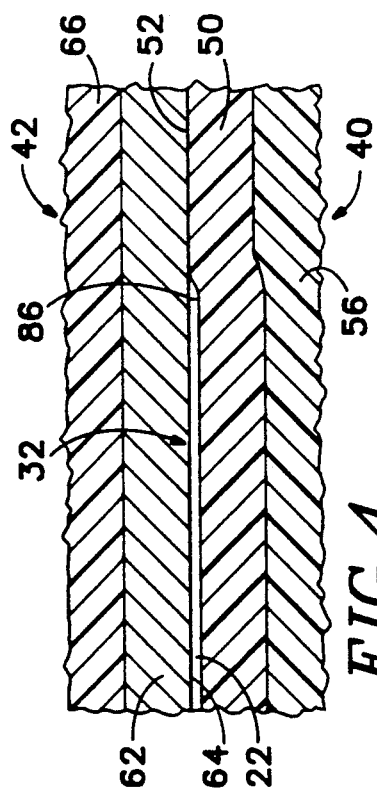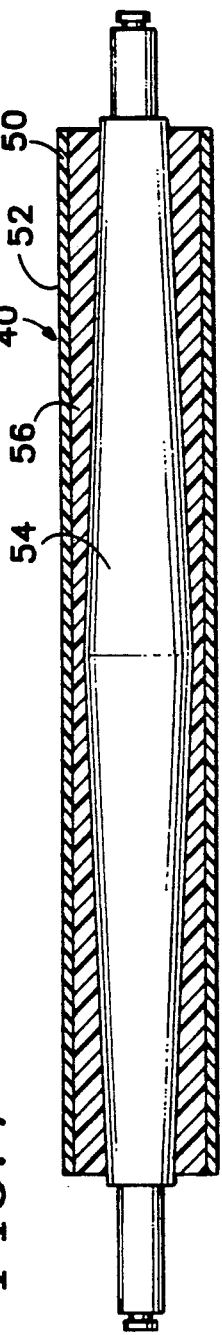

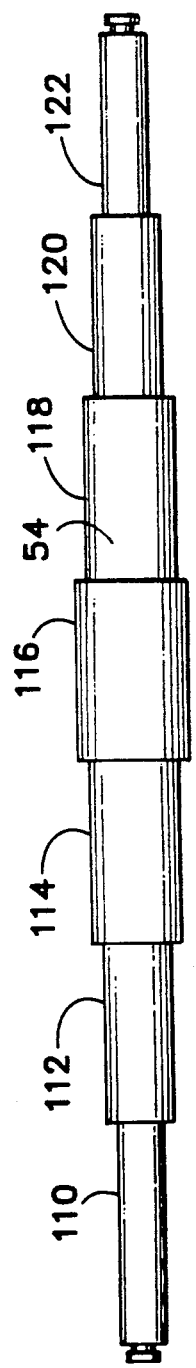
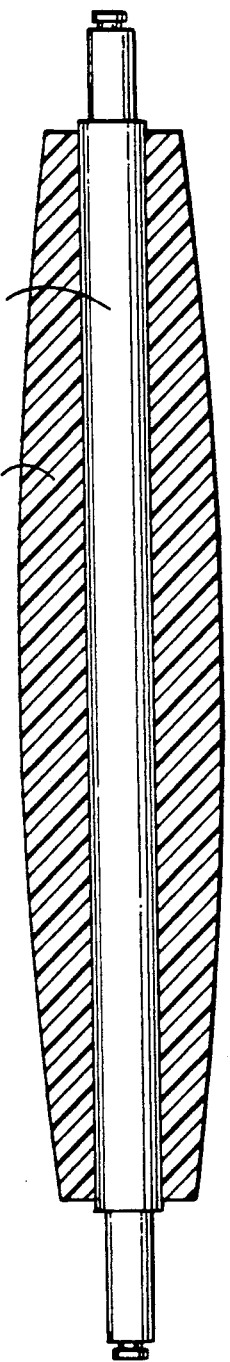
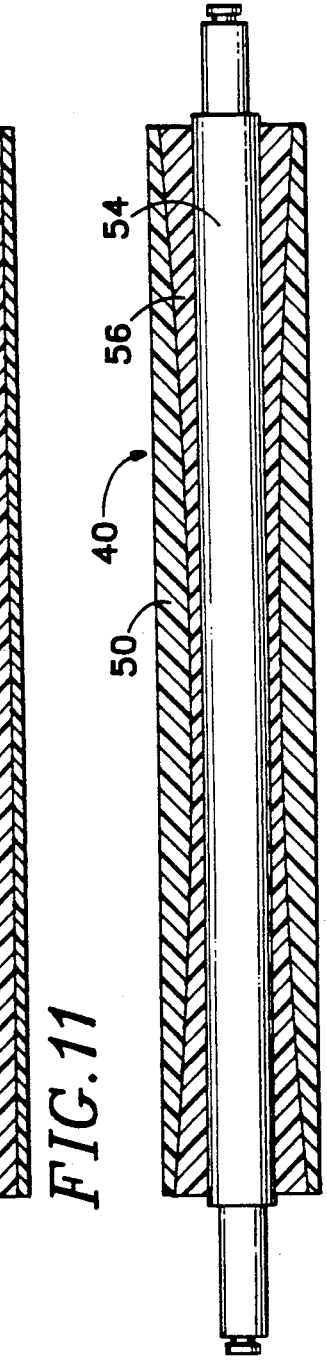
FIG. 8  FIG. 9  FIG. 11  FIG. 12

PRESSURE FIXING AND DEVELOPING APPARATUS

BACKGROUND OF THE INVENTION

The present invention relates to a roll-type pressure fixing and developing apparatus in which ink containing sheet material to be treated is passed through a high pressure nip defined by a pair of rollers and is also directed to a roller for such an apparatus.

It is known to pass sheet media on which an image is to be fixed or developed through a high pressure nip defined by a pair of rollers. Commonly, the outer ends of at least one of the two rollers is loaded with a pressure applying load applied in a direction normal to the axis of the roller. This load is also applied in a direction which biases the rollers together to form the nip. Application of a load in this manner results in bending moments in the loaded roller. The bending moments cause the roller to deflect or bow in the center such that there is a reduced or minimum fixing or developing pressure at the center of the nip. This deflection at the center of the roller increases when a sheet of media is inserted in the nip. As a result, uneven fixing of toners and ink to the media occurs. Higher pressures than necessary to fix toners and ink are then required at the ends of the nip to assure adequate pressure fixing at the center of the nip.

There are also devices in the prior art in which the rollers are skewed, that is, their longitudinal axes are supported out of parallel with one another, to compensate for the deflection of the fixing rollers. Skewing the rollers allows the ends of the rollers to wrap around each other as they deflect under load, resulting in more uniform pressure along the nip. However, skewing the rollers also results in forces which act on the media in a direction substantially perpendicular to the path the media travels. These lateral forces tend to crease or curl the media during passage through the nip. Also, such an apparatus is generally limited to pressure fixing at one pressure value. For example, higher pressure causes greater deflection in the rollers, which requires a greater skewing angle to avoid non-uniformity along the nip.

Other expedients have been introduced in an attempt to overcome the problem of deflection of fixing rollers upon the application of force to the ends of the rollers. Large diameter fixing rollers reduce, but do not eliminate, the deflection. However, large diameter fixing rollers add weight, cost and bulk to the apparatus. A backup roller or rollers in pressure contact with the pressure fixing and developing rollers has also been used to urge the pressure fixing rollers together along the nip. However, such backup roller systems require additional space for the backup rollers and also require additional components in comparison to a two-roller system.

Another method suggested in the prior art is the use of a roller which is crowned at the center to compensate for the deflection due to loading. However, crowned rollers have a faster surface velocity at their center than at their ends. This differential in surface velocity contributes to wrinkling of the media and limits the versatility of these devices in handling various types of substrates.

As a more specific example of the prior art, U.S. Pat. No. 4,363,862 of Giorgini discloses an apparatus for fixing toner powder images on sheet material. In Giorgini, a non-compliant pressure roller and compliant back up roller are supported with skewed longitudinal axes. The pressure roller is a rigid non-compliant material, such as steel, with a non-compliant outer layer having an irregular surface comprising a plurality of randomly sized dome projections. Chrome is one example of this surface material. The backup roller is described as having a sheath of a compliant material over a central core. Organic polymeric substances are mentioned as suitable for the sheath, with nylon 6/6, glass filled nylon, hard rubber and acetal resins being specifically mentioned. The core of this backup roller is described as being of a rigid non-compliant material.

U.S. Pat. No. 4,768,050 of Beery discloses a pair of pressure rollers used in conjunction with the "Mead" imaging process in which photosensitive micro capsules are ruptured by the rollers to provide the image. This apparatus includes a first roller having a hollow shell with an axially central part defining a loading region. A loading shaft extends through the shell and is joined to the shell only at the central loading region. The interior surface of the shell is partially tapered, and is described as controlling the deflection of the shell portion of the roller when the roller is loaded at its ends. The rollers define a working zone and are relieved at their ends to provide non-working regions. With this design, due to the excessive pressures at the ends of the rollers, the working zone must be less than the width of the rollers, as otherwise sheet material passing through the rollers can be damaged. Therefore, this apparatus lacks versatility in being able to effectively treat sheet material of varying widths.

U.S. Pat. No. 4,356,764 of Haugen discloses a pair of rollers which each include a central core of a uniform diameter and an outer hollow shell. Pressure transfer rollers support the shells on their respective cores with the transfer rollers engaging the supported shells at four spaced locations. Because the shell is supported at discrete locations by the transfer rollers, a less than uniform pressure would be expected along the nip. This is particularly expected to be the case when one of the outer cylindrical shells is made of an elastic material, such as rubber of about 35-60 durometer, as mentioned in one embodiment of this apparatus.

The use of pressure fixing rolls for fusing or spreading solidified hot melt ink on print media is also known. Japanese Patent Specification No. 60-18,351 of Moriguchi, et al. and U.S. Pat. No. 4,745,420 of Gerstenmaier are two examples of these types of devices. The construction of pressure rollers is not described in these two patents. Also, the Gerstenmaier patent uses an eccentric for varying the pressure applied to the rollers. Other examples of prior art image fixing apparatus including rollers are described in U.S. Pat. Nos. 3,293,059 of Stowell, 3,566,076 of Fantuzzo and 4,568,949 of Muranaka.

Prior art pressure fixing rolls known to the inventor suffer from problems when treating media of widely varying thickness types and/or widths.

Although a number of roll-type pressure developing and fixing devices are known, a need exists for such an apparatus, and for rollers for such an apparatus, which is capable of overcoming these and other disadvantages of the prior art.

SUMMARY OF THE INVENTION

In accordance with one aspect of the present invention, a roller for a roll type fixing and developing apparatus in which sheet material to be treated is passed through a high-pressure nip defined by a pair of rolls, comprises an elongated tubular shell with a pressure applying external surface, an elongated core positioned within the tubular shell, and an elastomeric material disposed between the core and shell. The elastomeric material of this roller supports the shell on the core. With this construction, the distribution of the load along the line of contact defining the nip can be controlled for a particular application. In one preferred embodiment, the line load is controlled to be slightly higher at the center of the line. This construction minimizes the tendency for media to wrinkle so that widely varying types of media may be processed. Also, uniform fusing of the ink is still accomplished.

In accordance with another aspect of the present invention, the core has first and second ends and a longitudinal axis and also has an increasing cross sectional dimension moving from the respective ends of the core toward the center of the core. In a more specific embodiment of the invention, the core, in longitudinal cross section, has a crown in the shape of a beam deflection curve for a simply supported, uniformly loaded constant cross section beam. In an alternative embodiment, the core increases in cross sectional dimension in discrete steps moving from the ends of the core toward the center of the core. In a still further embodiment, the core may be tapered from its center toward its first and second ends. Equivalently, the shell may be provided with a varying cross section, being thicker at the center than at the ends in the same manner as the core varies in thickness. In each case, the line load is slightly higher at the center of the line.

The shell may be of a rigid, non-compliant material or of a compliant material such as a polymer. Typically, one roll of the pressure fixing and developing apparatus has a rigid pressure applying surface while the other roll has a compliant pressure applying surface, particularly when media containing phase-change or hot-melt ink is being treated.

As another aspect of the present invention, the elastomer preferably has a durometer of from about Shore A 30-60 and fills the space between the shell and core to provide continuous support for the shell and thereby for the pressure applying surface. In one form of the invention, the elastomer may be compressed at the center of the roller relative to the ends of the roller to preload the center portion of the roller.

It is preferable that the rollers defining the nip are oriented with longitudinal axes parallel to one another. Also, both rollers may be of a construction which includes a shell, a core, and elastomeric material disposed between the core and shell. It has also been found that improved results are achieved when only one of the rollers of this improved design is included in the apparatus.

It is therefore an object of the present invention to provide an improved roll-type fixing and developing apparatus in which ink containing sheet material to be treated is passed through a high pressure nip defined by a pair of rolls.

It is another object of the present invention to provide an improved roller for such an apparatus.

A further object of the present invention is to provide an apparatus capable of treating media of widely varying thickness and widths.

It is a further object of the present invention to provide an apparatus which is capable of treating a wide variety of media, such as transparencies, envelopes, papers of various types including onion skin to eighty pound card stock and higher, plain and coated papers, drafting vellum, and so forth, without damaging the media.

Another object of the present invention is to provide such an apparatus which can compress hot melt ink which has been solidified on media, whether the ink is present in a single layer, multiple layers, or a combination of such single and multiple layers, on a sheet of media.

Still another object of the present invention is to provide an apparatus of this type which is capable of applying the desired pressure to the media independent of the media thickness, the width of the media, and the thickness of ink on the media.

A further object of the present invention is to provide an apparatus in which the line pressure or load applied to the media at the center of the nip is somewhat higher than the line pressure applied to the media at the ends of the nip.

These and other objects, features and advantages of the present invention will become apparent with reference to the following description and drawings.

IN THE DRAWINGS

FIG. 4 is an enlarged sectional view of a portion of two rollers in accordance with the present invention showing the edge of a sheet of media passing between the rollers;

FIG. 5 is an enlarged view of two rollers in accordance with the present invention showing the treatment of media containing both single and multiple layers of ink;

FIG. 6 is a partial schematic illustration of one type of support, loading and drive mechanism for a roll type fixing and developing apparatus, which includes one or more rollers of the present invention;

FIG. 7 is a side elevational view, partially in section, showing another type of core for a roller of the invention;

FIG. 8 is a side elevational view of another form of core for a roller of the present invention;

FIG. 9 is a side elevational view, partially in section, of a core with elastomer thereon configured to preload the elastomer at the center of a roller when the core and elastomer are combined with the shell;

FIG. 10 is a side elevational view, partially in section, of the core and elastomer assembly of FIG. 9 shown being inserted into a shell;

FIG. 11 is a side elevational view, partially in section, showing another form of roller in accordance with the present invention; and FIG. 12 is a side elevational view, partially in section, showing another form of roller in accordance with the present invention.

DETAILED DESCRIPTION OF PREFERRED EMBODIMENTS

In general, the present invention comprises a roll-type fixing and developing apparatus in which sheet material to be treated is passed through a high pressure nip defined by a pair of rolls and to a roller for such an apparatus. The apparatus has applicability to the fixing of toner powders on media, to "Mead" process applications in which photosensitive microcapsules are ruptured by passing one or more sheets containing such capsules between rollers, and to other applications in which pressure is used to fix, fuse or develop images on media. The invention has particular applicability to the fixing of images formed by hot melt ink droplets solidified on media. In such cases, particularly in color applications, both single and multiple layers of ink are usually present simultaneously on the media. To produce a high quality image, it is desirable to apply substantially uniform pressure to areas of the media containing the multiple layers and to areas containing single layers of ink droplets. The present invention accomplishes the desired fixing of solidified phase change ink droplets even under these circumstances. For purposes of convenience, and without limiting the broad applicability of the present invention to image fixing and developing apparatus in general, the following description is directed toward the use of the apparatus in fixing solidified hot-melt ink droplets on media.

Figure 1:
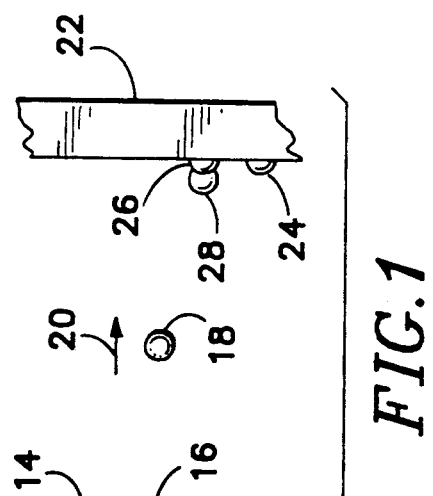
FIG. 1 is a schematic representation of an ink jet apparatus for jetting hot melt or phase change ink onto media.

Referring to FIG. 1, a printer has an ink jet print head 14 which includes an ink drop ejection orifice 16 from which ink drops, one being indicated at 18, are ejected in the direction of arrow 20 toward a sheet of ink drop receiving media 22. The ink jet print head 14 may take any form and may be of the drop-on-demand type, wherein droplets are only ejected in response to the state of energization of an associated transducer. Ink jet 14 may also be of the continuous type and may optionally be provided with an air assist for accelerating the delivery of ink drops toward the media. One suitable ink jet print head is described in U.S. Pat. No. 4,727,378 to Le et al. In the case of hot-melt or phase-change ink, solidified ink is heated so as to be in a liquid state when ejected from the orifice 16. Ink drops 24, 26 and 28 are shown in FIG. 7 following their deposition on the target or media 22. These dots 24, 26 and 28, as well as other dots on the media, undergo a liquid to solid phase transition on the media. Also, the dots project somewhat from the surface of the media, the projection being exaggerated in FIG. 1. Certain types of media, such as transparencies, are not significantly penetrated by the ink droplets impinging thereon. As a result, for such media the droplets tend to project to a greater degree than from other types of more porous media, such as plain paper.

In the subtractive primary system of ink-jet printing, secondary colors (red, green, and blue) are achieved by jetting droplets of two primary colors on top of one another. In the case of phase-change ink-jets, this results in areas being covered with different thicknesses of ink as represented by the dots 26, 28 shown on top of one another in FIG. 1. This area of the media should be contrasted with the thickness of the single layer of ink represented by droplet 24. It is desirable in any pressure fusing or fixing application, that sufficient pressure be applied to the ink even though ink layers present on the media may be of different thicknesses.

Figure 2:
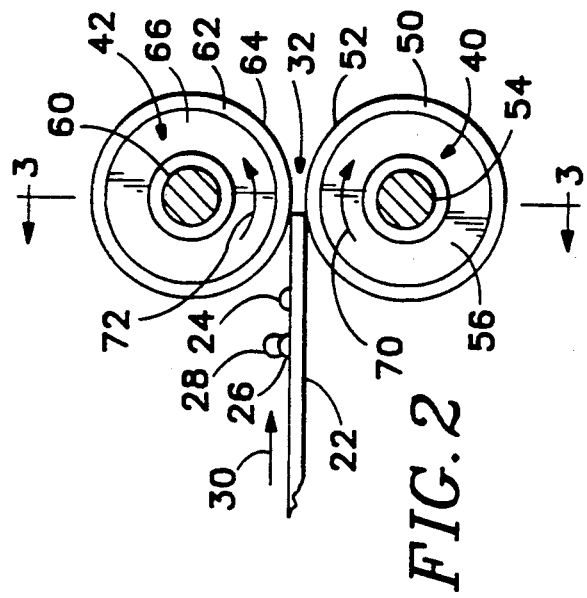
FIG. 2 is an end view, partially in section, and taken along line 2—2 of FIG. 3, showing media entering the nip between a pair of rollers in accordance with the present invention.

In FIG. 2, the ink containing media 22 is shown traveling in the direction of arrow 30 toward a high pressure nip 32 defined between a pair of rollers 40, 42. Roller 40 includes an elongated outer tubular shell 50 which has an external pressure applying surface 52. The surface 52 is typically smooth and of a right cylindrical shape. Although variations are possible, the illustrated shell 50 is of a uniform thickness throughout its length. An elongated core 54 is inserted into and extends along the length of the shell 50. The core 54 and shell 50 are concentric with one another, that is, their respective longitudinal axes are coincident. An elastomeric material 56 is disposed between the core and shell, the elastomeric material supporting the shell on the core. As a result, torque applied to the core 54 is transmitted by the elastomer 56 to the shell as the core and shell are coupled together by the elastomer. If one of the rollers 40 or 42 is steel with the other roller being of the described core, elastomeric and shell combination, and if only the steel roller is driven, then only very little torque is transmitted through the elastomer.

Figure 3:
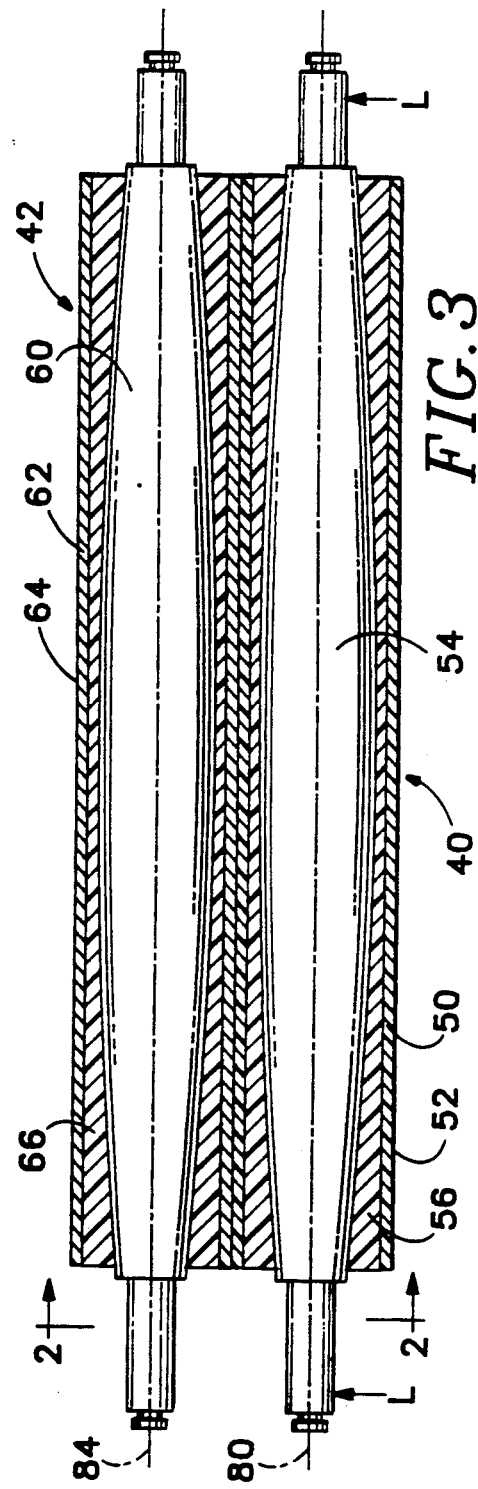
FIG. 3 is a side elevational view, partially in section, of the rollers of FIG. 2, taken along line 3—3 of FIG. 2.

The core 54 may be of a rigid, preferably non-compliant, material such as steel. By leaving the surface of the core somewhat rough, for example following machining or casting, better adhesion to the elastomer is achieved. The elastomeric material 56 is compliant, and has a preferred durometer between Shore A 30 and 60, with a durometer of 35-45 being most preferred. As shown in FIG. 3, the elastomeric material fills the entire space between the core and shell so as to provide continuous support for the shell along the full length of the nip. The elastomeric material transfers both torque and pressure from the core to the shell and in effect performs as a low rate spring. One specific example of a suitable elastomer is REN:C:O-Thane, available from Ciba-Geigy Company.

In the FIG. 2 form of the invention, the shell 52 is preferably of a compliant material and most preferably is of a polymeric material. Examples of suitable materials for the shell 52 include acetal homo polymer and nylon 6/6 from the E. I. DuPont Corporation. As explained below, by using a compliant shell 52, the roller 40 has the enhanced capacity to effectively treat paper containing differing thicknesses of ink. At the same time, the pressure between the rollers 40, 42 is maintained across the length of the nip even though the thickness of the ink varies. In addition, the use of a compliant shell, again as explained more fully below, allows the roller to deform at the edge of the media to thereby also enhance the uniformity of the line pressure across the edge of the media. Thus, the shell 52 is capable of conforming to the thickness of the media and ink on the media, and yet is hard enough to define a high pressure nip and prevent the torque requirements of driving the rollers from becoming too extreme.

In FIG. 2, the roller 42 is also shown with a central core 60, an outer tubular shell 62 having an external pressure applying surface 64, and an elastomeric material 66 supporting the shell on the core. The roller 42 may be similar in construction to the roller 40. However, in a preferred form of the invention, the roller 42 may be solid steel or be provided with a shell 62 of a rigid, non-compliant material such as steel. As a specific example, shell 62 may be of a material having a Rockwell hardness from the high 50's to the mid 60's, with a Rockwell hardness of C-60 being one specific example. The surface 64 of the shell 62 is finished in a conventional manner to be very smooth. The shell 62 may be chrome plated in a conventional manner for corrosion resistance. Thus, roller 42 provides a hard surface against which the ink coated surface of sheet 22 passes between the nip 32. The roller 42 may be of a different diameter than the roller 40. For example, a relatively small diameter roller 42 may be used, without a backup roller. At the same time, shell 52 provides a compliant surface for receiving the media. The respective rollers 40, 42 are shown rotating in the direction of arrows 70, 72 to pass the media 22 through the nip 32. Typically roll 42 is driven while roll 40 is driven by being in surface contact with roll 42. Of course, the rolls 40, 42 may be geared or otherwise coupled together for driving purposes or separately driven if desired.

Referring to the illustrated FIG. 3 embodiment, each of the illustrated cores 54, 60 are identical and therefore only core 54 will be described. The core 54 may be hollow, but is typically solid with an increasing transverse cross-sectional dimension from the respective ends of the core to the center of the core. More specifically, the illustrated core 54 has been designed in longitudinal cross-section to have a crown in the shape of a beam deflection curve for a simply supported uniformly loaded constant cross-section beam. Consequently, when the respective ends of the core 54 are loaded with a load L in a direction normal to the longitudinal axis 80 of the core, this configuration of the core assists in producing the desired load profile along the full length of the pressure nip.

In one specific example, provided to illustrate the compactness of the roller, the roller 40 may have an outer diameter of 1.74 inches and be approximately 12.3 inches long. The core is typically 0.8 inches at the ends of the core and 1.4 inches in diameter at the center of the core with a 0.05 inch gap or space being provided between the core and shell at the center of the core. This gap, as well as the remaining space between the shell and core, is filled with the elastomeric material 56. When loaded with a load L, for example a load sufficient to produce 85-100 lbs. per lineal inch along the nip, a pressure fixing and developing apparatus of this construction is useable to treat media along the full width of the nip. Therefore, in this specific example, 12.3 inch wide media can be treated. At the same time, narrower media may also be treated with excellent results and without requiring the media to be centered between the nips.

Also, with the construction shown in FIG. 3 and with the longitudinal axis 80 of roller 40 supported parallel to the longitudinal axis 84 of the roller 42, a slightly higher pressure is achieved between the rollers at the center of the nip than at the ends of the nip. This pressure can be decreased by decreasing the cross sectional dimension of the core at its center and increased by increasing the cross sectional dimension of the core at its center. Although a uniform pressure across the full length of the nip has proven desirable, a design in which the nip pressure at the center of the rollers is slightly higher than at the ends of the rollers has virtually eliminated wrinkling of the media. Preferably the pressure at the center of the rollers is from 1%-40% higher than the pressure at the ends of the rollers with a 10% to 20% differential being most preferred and a 15% differential being a specifically preferred pressure differential. The higher the pressure differential, the better the apparatus resists wrinkling of media and the less uniform the fusing. Conversely, the lower the pressure differential, the more uniform the fusing and the higher the chance of wrinkling some types of media. (The wrinkling problem is still minimal, however, with the present invention.)

As shown in FIG. 4, as media 22 passes through the nip 32, the compliant shell 52 deforms to accommodate the edge 86 of the sheet 22. Consequently, high localized pressure is not produced at the edge of the sheet. High localized pressure would contribute to the wrinkling or tearing of the sheet as it passes between the rollers. It has been found that the apparatus of the present invention is usable to process media of varying widths and thicknesses. For example, envelopes, paper ranging in weight from onion skin to 80 pound stock, drafting vellum, transparency film and other media printed with hot melt ink have all been treated using the apparatus of the present invention.

Returning again to FIG. 3, the roller 42 may be replaced with a conventional roller, such as of solid steel or the like. In such a case, the benefits of the invention are still in large part achieved when a roller 40 of the FIG. 3 type is used in conjunction with the conventional roller 42. Again the roller 42 serves to provide the desired line pressure.

With reference to FIG. 5, and to further illustrate the performance of the present invention, a sheet of media 22 is shown with single and double layers of ink passing through the nip 32. Due to the compliance of the shell 42, virtually all of the media containing the single layer of ink (i.e., drop 24 being one example in this figure) and all of the area containing the multiple layers of ink (i.e., two such layers 26 and 28 being shown in this figure) are subjected to pressure by the pressure applying rolls 40, 42.

When pressure is applied to these ink drops, they tend to spread on the media. An increase in area covered by the dots of about 100 percent on transparencies is one specific illustration of these results. Consequently, higher quality color images are achieved, particularly where multiple layers of ink are being pressure treated simultaneously with the pressure treatment of layers of ink of a lower thickness.

With reference to FIG. 6, one means of supporting, driving and applying pressure to the pressure rollers 40 and 42 is shown. In FIG. 6, a steel roller 40, with a shaft 60, is shown above a roller 42, with the shell, core and elastomer. The ends of the core 54 and the ends of the shaft 60 are journaled to a frame 88 to thereby rotatably support the respective rollers 40, 42. Also, the ends of core 54 are carried by a sliding block portion of frame 88 so that the roller 42 can shift upwardly against the roller 40. The rollers are biased together at their respective ends by a spring or other biasing mechanism, one being shown at 89. The roller 40 may be driven, as by a motor 90 and belt 92, coupled to a pulley 93 on shaft 60, in the direction of arrow 94. A caming element 96 is pivotally mounted by a bushing 98 to the end of the core 54. This caming element has a caming surface 100 and an outwardly projecting stop engagement pin 103. When roller 40 is driven in the direction of the arrow 94, the rollers 40, 42 engage one another and caming element 96 rotates counterclockwise in FIG. 6 until pin 103 engages a frame mounted stop 105. In this case, the caming element 96 is spaced from a caming element 101 keyed to shaft 60, the rollers 40, 42 are together, and pressure is applied across the nip by the outer surfaces of the rollers. When the roller 40 is driven in the opposite direction from arrow 94, caming element 96 is rotated clockwise in FIG. 6 by the engaged rollers. As caming surface 100 engages the caming element 101, the elements 96, 101 shift the rollers 40, 42 apart and relieves the load from the pressure surfaces of the rollers. Typically, the pressure is relieved at times when the apparatus is not being used to treat paper so that flat spots do not form on the outer surface of the shell of roller 42. Of course, other drive mechanisms and pressure applying mechanisms are also suitable.

With reference to FIG. 7, an alternative form of roller 40 is illustrated. In this figure, as well as in the remaining figures mentioned below, elements in common with the elements shown in FIG. 3 are assigned like numbers and will not be discussed in detail. In the FIG. 7 form of the invention, the core 54 has an increasing transverse cross-sectional dimension or diameter moving from the respective ends of the core toward the center of the core. However, in this case, the core is tapered in a straight line fashion from the center of the core toward the respective ends of the core. With this construction, the pressure at the center of the roller will be somewhat higher than the pressure at the ends of the roller. In addition, the pressure distribution across the nip will drop off to a somewhat greater extent toward the ends of the roller than in the FIG. 3 embodiment.

In FIG. 8, the core 54 is shown with an outer surface having discrete steps 110, 112, 114, 116, 118, 120 and 122, rather than a continuously curved surface as shown in FIG. 3. Again, the transverse cross-sectional dimension of the core increases moving from the outer ends of the core toward the center of the core. At each step (i.e. 110-112) along the length of the core, some differential in nip pressure is expected at the surface of the shell in the region of the step. As the steps become smaller and more numerous, the core in effect performs as if it has no steps.

In FIG. 11, the core 54 is of a uniform cross-section with the shell 50 again being supported by elastomer 56 on the core. Although less desirable than the previously discussed constructions, the combination of a shell 50 supported by elastomer 56 on the core 54 does assist in producing favorable results in comparison to solid rollers. Also, harder elastomer may be used at the center of the roller than at the ends of the roller to increase the line pressure at the center of the rollers.

In FIG. 12, the thickness of the shell 50 is varied with the shell being thicker at the center than the ends. In this case, the interior surface of the shell has a similar shape as the outer surface of the core 54 in FIG. 3. Again the interior surface of the shell 54 may, in cross section, be in the shape of a beam deflection curve for a simply supported beam. Also, the shell may have its interior surface configured like the outer surface of the cores of the other examples. The result is a line pressure which is slightly higher at the center of the core than at the ends of the core.

FIGS. 9 and 10 illustrate an embodiment of the invention in which the elastomer 56 is formed on the core 54 with the elastomer increasing in cross-sectional dimension moving from the ends of the core toward the center of the core. In FIG. 9, the elastomer is shaped in longitudinal cross-section to have a crown similar to the crown of the core of FIG. 3. When, as shown in FIG. 10, the core and elastomer assembly is inserted (in direction of arrow 130) into the shell 50, the centermost portion of the elastomer is compressed. This makes the line pressure slightly greater at the center than at the ends and reduces the tendency of various papers to wrinkle.

Having illustrated and described the principles of my invention with reference to several preferred embodiments, it should be apparent to those skilled in the art that my invention may be modified in arrangement and detail without departing from such principles. I claim as my invention all such embodiments as fall within the scope of the following claims.

I claim:

1. Apparatus for pressure treating sheet material of arbitrary width by passing the material through a nip between first and second rollers to apply high localized pressure to the material and thereby treat the material without imparting wrinkling or other dimension distortion, said apparatus comprising first and second elongate cylindrical rollers, at least one of said first and second rollers comprising a tubular shell with a substantially cylindrical outer surface, an elongate concentric core having a main central section thereof disposed within the shell and spaced from the inner surface of the shell, and a body of elastomeric material interposed between the shell and core, means for supporting the rollers with their longitudinal axes substantially parallel and their outer cylindrical surfaces adjacent each other, said supporting means including means for urging the rollers together to apply a desired pressure load to sheet material passed through the nip between the rollers, and means for effecting a treatment pressure that decreases from the center of the nip toward the ends thereof to provide a pressure profile that effectively treats the material but minimizes wrinkling or other dimensional distortion of the treated material.

2. The apparatus of claim 1, in which the medial portion of said main section of the core is of larger diameter than either of the opposite ends of the section.

3. The apparatus of claim 2, in which the diameter of the main section of the core decreases progressively from the medial portion to the opposite ends of the section.

4. The apparatus of claim 2, in which the diameter of the main section of the core decreases in discrete steps from the medial portion to the opposite ends of the section.

5. The apparatus of claim 1, in which the shell has a greater thickness at a medial location midway between its ends than at either end thereof.

6. The apparatus of claim 5, in which said shell decreases progressively in thickness from said medial location to either end of the shell.

7. The apparatus of claim 1, in which the elastomeric material fills the space between the shell and core.

8. The apparatus of claim 7, in which the elastomer is more highly compressed in a radial direction at a medial location midway between the ends of the roller than it is at either end of the roller.

9. The apparatus of claim 7, in which the elastomer is harder at a location midway between the ends of the roller than at either end thereof.

10. The apparatus of claim 7, in which the elastomer has a Shore A durometer value of from about 30-60.

11. A roll type fixing and developing apparatus in which sheet material to be treated is passed through a high pressure nip defined by first and second elongate rollers, the apparatus comprising a first roller having a first longitudinal axis and a first pressure applying cylindrical surface with opposite first and second ends and a second roller having a second longitudinal axis and a second pressure applying cylindrical surface with opposite first and second ends, at least one of the first and second rollers having an elongate tubular shell with a pressure applying outer surface, the shell being of a hard, compliant material, an elongate core having a main central section thereof concentrically disposed within the tubular shell, the said section including opposite first and second ends, and a body of elastomeric material disposed between the main section of the core and the shell, supporting the shell on the core, support means for supporting the first and second rollers with the first longitudinal axis substantially parallel to the second longitudinal axis and with the first pressure applying surface bearing against the second pressure applying surface thereby to define a sheet material receiving nip between the contacting portion of the first and second surfaces, the support means comprising loading means for applying a load at the ends of at least one of the first and second cores to urge the first pressure applying surface against the second pressure applying surface, and means for effecting a nonuniform pressure on sheet material passed through the nip between the first and second pressure applying surfaces, the said pressure decreasing from the center of the nip toward the ends to provide a pressure profile that minimizes wrinkling or other dimensional distortion of the material.

12. The apparatus of claim 11, in which the diameter of the main section of the core is larger at the midpoint of said section than at either of said first and second ends.

13. The apparatus of claim 12, in which the diameter of the main section of said core decreases progressively from said midpoint toward said first and second ends.

14. The apparatus of claim 11, in which the shell has a greater thickness midway between its ends that at either end thereof.

15. The apparatus of claim 14, in which said shell decreases progressively in thickness from a location midway between its ends to either end of the shell.

16. The apparatus of claim 11, wherein said shell if formed of a polymeric material.

17. The apparatus of claim 11, wherein said elastomeric material has a Shore A durometer value of from about 30-60.

* * * * *